United States Patent
Nakaoka

(10) Patent No.: US 10,424,362 B2
(45) Date of Patent: Sep. 24, 2019

(54) MEMORY DEVICE AND DATA REFRESHING METHOD THEREOF

(71) Applicant: Winbond Electronics Corp., Taichung (TW)

(72) Inventor: Yuji Nakaoka, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/177,453

(22) Filed: Nov. 1, 2018

(65) Prior Publication Data

US 2019/0221251 A1  Jul. 18, 2019

(30) Foreign Application Priority Data

Jan. 16, 2018  (JP) ................. 2018-004995

(51) Int. Cl.
*G11C 11/406* (2006.01)
*G11C 11/408* (2006.01)

(52) U.S. Cl.
CPC ..... *G11C 11/40611* (2013.01); *G11C 11/4087* (2013.01)

(58) Field of Classification Search
CPC ...... G11C 11/406–40626; G11C 11/408–4087
See application file for complete search history.

(56) References Cited

U.S. PATENT DOCUMENTS

| 9,691,466 | B1 | 6/2017 | Kim | |
| 9,721,643 | B2 | 8/2017 | Bains et al. | |
| 9,805,783 | B2 * | 10/2017 | Ito | G11C 11/4087 |
| 9,892,779 | B2 * | 2/2018 | Kang | G06F 3/0619 |
| 2015/0003180 | A1 | 1/2015 | Kim | |
| 2016/0055896 | A1 | 2/2016 | Lim | |
| 2017/0011792 | A1 | 1/2017 | Oh et al. | |
| 2017/0140811 | A1 | 5/2017 | Joo | |
| 2017/0243632 | A1 | 8/2017 | Park et al. | |
| 2018/0061476 | A1 | 3/2018 | Kim | |

FOREIGN PATENT DOCUMENTS

| CN | 107068174 | 8/2017 |
| JP | 2006099877 | 4/2006 |
| TW | 201604890 | 2/2016 |

OTHER PUBLICATIONS

"Office Action of Japan Counterpart Application," dated Dec. 11, 2018, p. 1-p. 4.

* cited by examiner

*Primary Examiner* — Harry W Byrne
*Assistant Examiner* — R Lance Reidlinger
(74) *Attorney, Agent, or Firm* — JCIPRNET

(57) ABSTRACT

A memory device and a data refreshing method thereof are provided. When an automatic refresh word line address and a row hammer refresh word line address belong to the same memory cell array, memory cells corresponding to the automatic refresh word line address are refreshed, and a time to refresh memory cells corresponding to the row hammer refresh word line address is postponed.

10 Claims, 6 Drawing Sheets

MEMORY DEVICE AND DATA REFRESHING METHOD THEREOF

CROSS-REFERENCE TO RELATED APPLICATION

This application claims the priority benefit of Japan application serial no. 2018-004995, filed on Jan. 16, 2018. The entirety of the above-mentioned patent application is hereby incorporated by reference herein and made a part of this specification.

BACKGROUND

Technical Field

The disclosure relates to an electronic device and more particularly relates to a memory device and a data refreshing method thereof.

Description of Related Art

Traditionally, row hammer is usually solved by performing an additional refresh operation. However, the retention time of the memory cells corresponding to the selected word line will decrease with the increase of the number of times that the selected word line is turned on. If the other memory cells are preferentially refreshed constantly, the time for refreshing the memory cell that is supposed to be refreshed will be postponed, which may cause the memory cell to lose the data stored therein before the next refreshing.

SUMMARY

The disclosure provides a memory device and a data refreshing method thereof for effectively preventing the memory cells from losing the data stored therein.

A memory device of the disclosure includes a memory block and a memory control circuit. The memory block includes a first memory cell array and a second memory cell array, wherein the first memory cell array corresponds to a first address section. The second memory cell array corresponds to a second address section. The memory control circuit periodically refreshes memory cell data of the first memory cell array and the second memory cell array alternately. When a row hammer event occurs, the memory control circuit compares an automatic refresh word line address with a row hammer refresh word line address to determine whether the automatic refresh word line address and the row hammer refresh word line address belong to a same memory cell array, and if the automatic refresh word line address and the row hammer refresh word line address belong to the same memory cell array, the memory control circuit refreshes a memory cell corresponding to the automatic refresh word line address and postpones a time for refreshing a memory cell corresponding to the row hammer refresh word line address.

According to an embodiment of the disclosure, a bit value of a highest bit of a word line address of the first memory cell array is different from a bit value of a highest bit of a word line address of the second memory cell array, and the memory control circuit determines whether the automatic refresh word line address and the row hammer refresh word line address belong to the same memory cell array according to a bit value of a highest bit of the automatic refresh word line address and a bit value of a highest bit of the row hammer refresh word line address.

According to an embodiment of the disclosure, the memory control circuit refreshes the memory cell corresponding to the row hammer refresh word line address, for which refreshing is postponed, in a next data refreshing cycle of the memory block.

According to an embodiment of the disclosure, if the automatic refresh word line address and the row hammer refresh word line address do not belong to the same memory cell array, the memory control circuit refreshes the memory cell corresponding to the automatic refresh word line address and the memory cell corresponding to the row hammer refresh word line address simultaneously.

According to an embodiment of the disclosure, the memory control circuit includes an automatic refresh word line address register, a row hammer refresh word line address register, a comparison circuit, a first multiplex circuit, a second multiplex circuit, a first decoder, and a second decoder. The automatic refresh word line address register stores the automatic refresh word line address. The row hammer refresh word line address register stores the row hammer refresh word line address. The comparison circuit is coupled to the automatic refresh word line address register and the row hammer refresh word line address register and compares the automatic refresh word line address with the row hammer refresh word line address to determine whether the automatic refresh word line address and the row hammer refresh word line address belong to the same memory cell array. The first multiplex circuit is coupled to the first memory cell array, the automatic refresh word line address register, and the row hammer refresh word line address register and outputs a word line address for memory cell data refreshing according to the automatic refresh word line address and the row hammer refresh word line address. The second multiplex circuit is coupled to the second memory cell array, the automatic refresh word line address register, and the row hammer refresh word line address register and outputs a word line address for memory cell data refreshing according to the automatic refresh word line address and the row hammer refresh word line address. The first decoder is coupled to the first multiplex circuit and decodes the word line address outputted by the first multiplex circuit to select a word line for memory cell data refreshing. The second decoder is coupled to the second multiplex circuit and decodes the word line address outputted by the second multiplex circuit to select a word line for memory cell data refreshing.

According to an embodiment of the disclosure, the first multiplex circuit and the second multiplex circuit respectively include a logic circuit, a selection circuit, and a latch circuit. The logic circuit is coupled to the automatic refresh word line address register and the row hammer refresh word line address register and outputs a selection control signal according to the bit value of the highest bit of the automatic refresh word line address and the bit value of the highest bit of the row hammer refresh word line address. The selection circuit is coupled to the logic circuit, the automatic refresh word line address register, and the row hammer refresh word line address register and outputs a word line address signal according to the selection control signal, a bit value other than the highest bit in the automatic refresh word line address, and a bit value other than the highest bit in the row hammer refresh word line address. The latch circuit is coupled to the logic circuit and the selection circuit and latches the word line address signal, wherein the first decoder and the second decoder select the word line for memory cell data refreshing according to a latch result of the corresponding latch circuit.

The disclosure further provides a data refreshing method adapted for a memory device, which includes a memory block having a first memory cell array and a second memory cell array. The first memory cell array corresponds to a first address section and the second memory cell array corresponds to a second address section, and memory cell data of the first memory cell array and the second memory cell array is periodically refreshed. The data refreshing method includes the following. An automatic refresh word line address is compared with a row hammer refresh word line address. If the automatic refresh word line address and the row hammer refresh word line address belong to a same memory cell array, a memory cell corresponding to the automatic refresh word line address is refreshed and a time for refreshing a memory cell corresponding to the row hammer refresh word line address is postponed.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DETAILED DESCRIPTION OF DISCLOSED EMBODIMENTS

Figure 1:
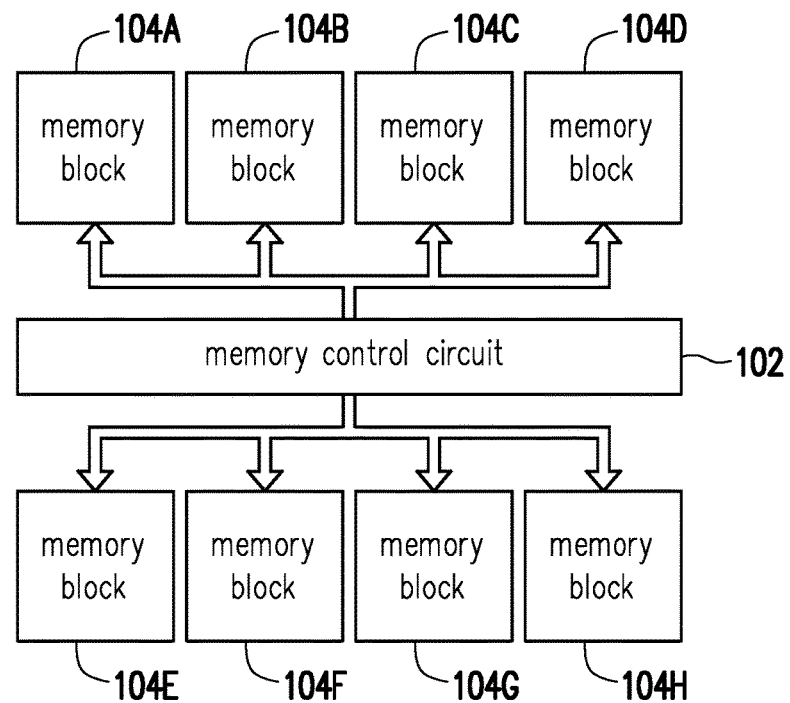
FIG. 1 is a schematic diagram of a memory device according to an embodiment of the disclosure.

FIG. 1 is a schematic diagram of a memory device according to an embodiment of the disclosure. Referring to FIG. 1, the memory device includes a memory control circuit 102 and a plurality of memory blocks 104A to 104H. The memory device includes the memory control circuit 102 that is capable of periodically refreshing memory cell data for each memory block automatically, so as to prevent the data stored in each memory block from being lost.

Figure 2:
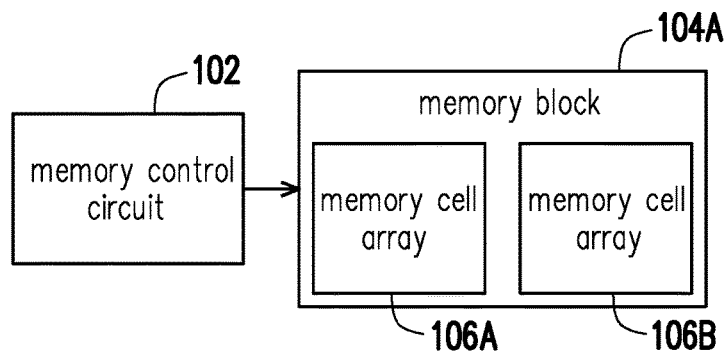
FIG. 2 is a schematic diagram of a memory device according to another embodiment of the disclosure.

FIG. 2 is a schematic diagram of a memory device according to another embodiment of the disclosure. More specifically, each memory block may include two separate memory cell arrays. In the embodiment as shown in FIG. 2, the data refreshing of the memory device is described based on the memory block 104A as an example, and the memory cell data refreshing for the other memory blocks may be performed in the same manner. As shown in FIG. 2, the memory block 104A includes a memory cell array 106A and a memory cell array 106B. The memory cell array 106A corresponds to a first address section and the memory cell array 106B corresponds to a second address section. In this embodiment, the first address section corresponding to the memory cell array 106A and the second address section corresponding to the memory cell array 106B may be composed of 14 bits respectively, for example, but the disclosure is not limited thereto. A bit value of the highest bit of the word line address corresponding to the memory cell array 106A is different from a bit value of the highest bit of the word line address corresponding to the memory cell array 106B. For example, the bit value of the highest bit of the word line address corresponding to the memory cell array 106A may be set to "0" and the bit value of the highest bit of the word line address corresponding to the memory cell array 106B may be set to "1". Nevertheless, the disclosure is not limited thereto.

The memory control circuit 102 may periodically refresh the memory cell data alternately for the memory cell array 106A and the memory cell array 106B. For example, when the memory cell data of the memory cell array 106A has been refreshed, the memory control circuit 120 may refresh the memory cell data of the memory cell array 106B after a predetermined period of time, and then refresh the memory cell data of the memory cell array 106A after another predetermined period of time, and so on.

When a row hammer event occurs, the memory control circuit 102 may compare an automatic refresh word line address with a row hammer refresh word line address to determine whether the automatic refresh word line address and the row hammer refresh word line address belong to the same memory cell array. The automatic refresh word line address is a word line address to be based on for periodically refreshing the memory cell data of the memory cell array 106A and the memory cell array 106B, and the row hammer refresh word line address is a word line address where occurrence of the row hammer event is detected. For example, the memory control circuit 102 may compare the bit value of the highest bit of the automatic refresh word line address with the bit value of the highest bit of the row hammer refresh word line address to determine whether the automatic refresh word line address and the row hammer refresh word line address belong to the same memory cell array. If the automatic refresh word line address and the row hammer refresh word line address do not belong to the same memory cell array, the memory control circuit 102 may simultaneously refresh the memory cell corresponding to the automatic refresh word line address and the memory cell corresponding to the row hammer refresh word line address.

On the other hand, if the automatic refresh word line address and the row hammer refresh word line address belong to the same memory cell array, the memory control circuit 102 refreshes the memory cell corresponding to the automatic refresh word line address and postpones a time for refreshing the memory cell corresponding to the row hammer refresh word line address, so as to prevent the memory control circuit 102 from preferentially refreshing the memory cell not corresponding to the automatic refresh word line address constantly, which may postpone the time for the memory cell that is supposed to be refreshed and cause the memory cell corresponding to the automatic refresh word line address to lose the data stored therein. In addition, the memory cell corresponding to the row hammer refresh word line address, for which refreshing is postponed, may be refreshed, for example, in the next data refreshing cycle of the memory block 104A. That is, the data of the memory cell is refreshed next time the data of the memory block 104A is refreshed automatically. Since the data of the memory cell array 106A and the memory cell array 106B are automatically refreshed alternately, the memory cell corresponding to the row hammer refresh word line address is definitely refreshed together with the memory cell corresponding to the automatic refresh word line address next time the data of the memory block 104A is refreshed automatically.

Figure 3:
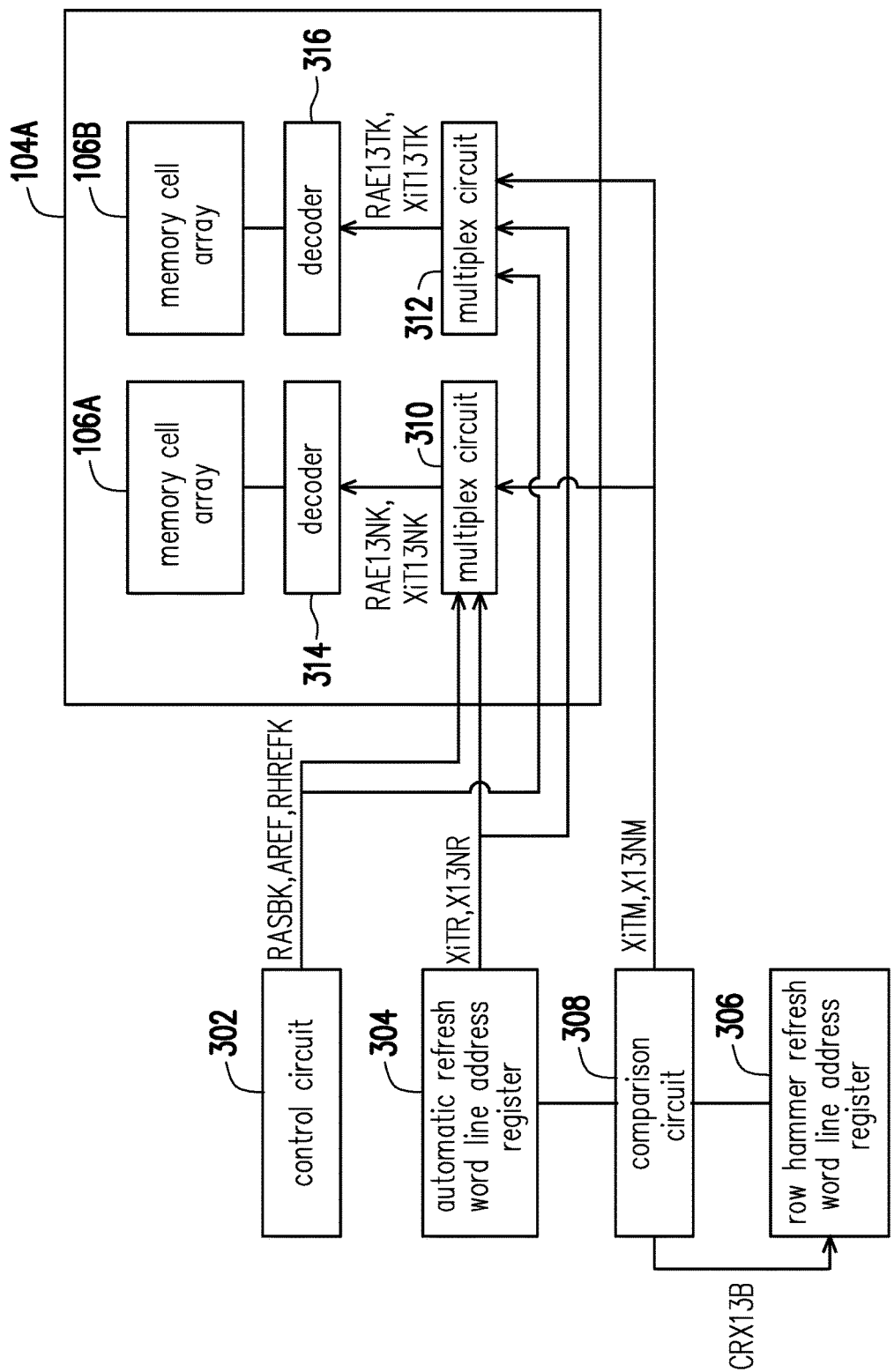
FIG. 3 is a schematic diagram of a memory device according to another embodiment of the disclosure.

FIG. 3 is a schematic diagram of a memory device according to another embodiment of the disclosure. Referring to FIG. 3, the memory control circuit 102 may include a control circuit 302, an automatic refresh word line address register 304, a row hammer refresh word line address register 306, a comparison circuit 308, a multiplex circuit 310, a multiplex circuit 312, a decoder 314, and a decoder 316, for example. The comparison circuit 308 is coupled to the automatic refresh word line address register 304 and the row hammer refresh word line address register 306. The multiplex circuit 310 is coupled to the control circuit 302, the automatic refresh word line address register 304, the row hammer refresh word line address register 306, and the decoder 314. The multiplex circuit 312 is coupled to the control circuit 302, the automatic refresh word line address register 304, the row hammer refresh word line address register 306, and the decoder 316. The decoder 314 and the decoder 316 are further coupled to the memory cell array 106A and the memory cell array 106B respectively.

The control circuit 302 may output a partial block row selection signal RASBK for selecting a part of the memory blocks for data refreshing (for example, selecting memory blocks from the memory blocks 104A to 104H for data refreshing), an all block refresh signal AREF for selecting all the memory blocks for data refreshing, and a row hammer address refresh request signal RHREFK for selecting the memory block of the row hammer word line address (for example, from the memory blocks 104A to 104H) to the multiplex circuits 310 and 312, so as to select the memory blocks for data refreshing. The automatic refresh word line address register 304 may store automatic refresh word line address signals XiTR, X13TR, and X13NR, wherein the automatic refresh word line address signals X13NR and X13TR are the highest bits of the automatic refresh word line addresses corresponding to the memory cell arrays 106A and 106B respectively, and the automatic refresh word line address signal XiTR is the other bits in the automatic refresh word line address corresponding to the memory cell array 106B, wherein i=0 to 12. The row hammer refresh word line address register 306 may store row hammer refresh word line address signals XiTM, X13TM, and X13NM, wherein the row hammer refresh word line address signals X13NM and X13TM are the highest bits of the row hammer refresh word line addresses corresponding to the memory cell arrays 106A and 106B respectively, and the row hammer refresh word line address signal XiTM is the other bits in the row hammer refresh word line address corresponding to the memory cell array 106B, wherein i=0 to 12.

The comparison circuit 308 may compare the automatic refresh word line address signals X13TR and X13NR and the row hammer refresh word line address signals X13TM and Xl3NM stored in the automatic refresh word line address register 304 and the row hammer refresh word line address register 306 to generate a comparison result signal CRX13B, and determine whether the automatic refresh word line address and the row hammer refresh word line address belong to the same memory cell array according to the comparison result signal CRX13B. The multiplex circuit 310 and the multiplex circuit 312 may output partial block row enable signals RAE13NK and RAE13TK and partial block row address signals XiT13NK and XiT13TK according to the partial block row selection signal RASBK, the all block refresh signal AREF, the row hammer address refresh request signal RHREFK, the automatic refresh word line address signals XiTR, X13TR, and Xl3NR, and the row hammer refresh word line address signals XiTM, X13TM, and X13NM, so as to select the word line for memory cell data refreshing, wherein the partial block row enable signals RAE13NK and RAE13TK are respectively for enabling the word lines, and the partial block row address signals XiT13NK and XiT13TK are for selecting the word line for memory cell data refreshing, wherein i is equal to 0 to 12. The decoder 314 and the decoder 316 may decode the partial block row enable signals RAE13NK and RAE13TK and the partial block row address signals XiT13NK and XiT13TK to select the memory cell array and the word line for memory cell data refreshing.

Figure 4:
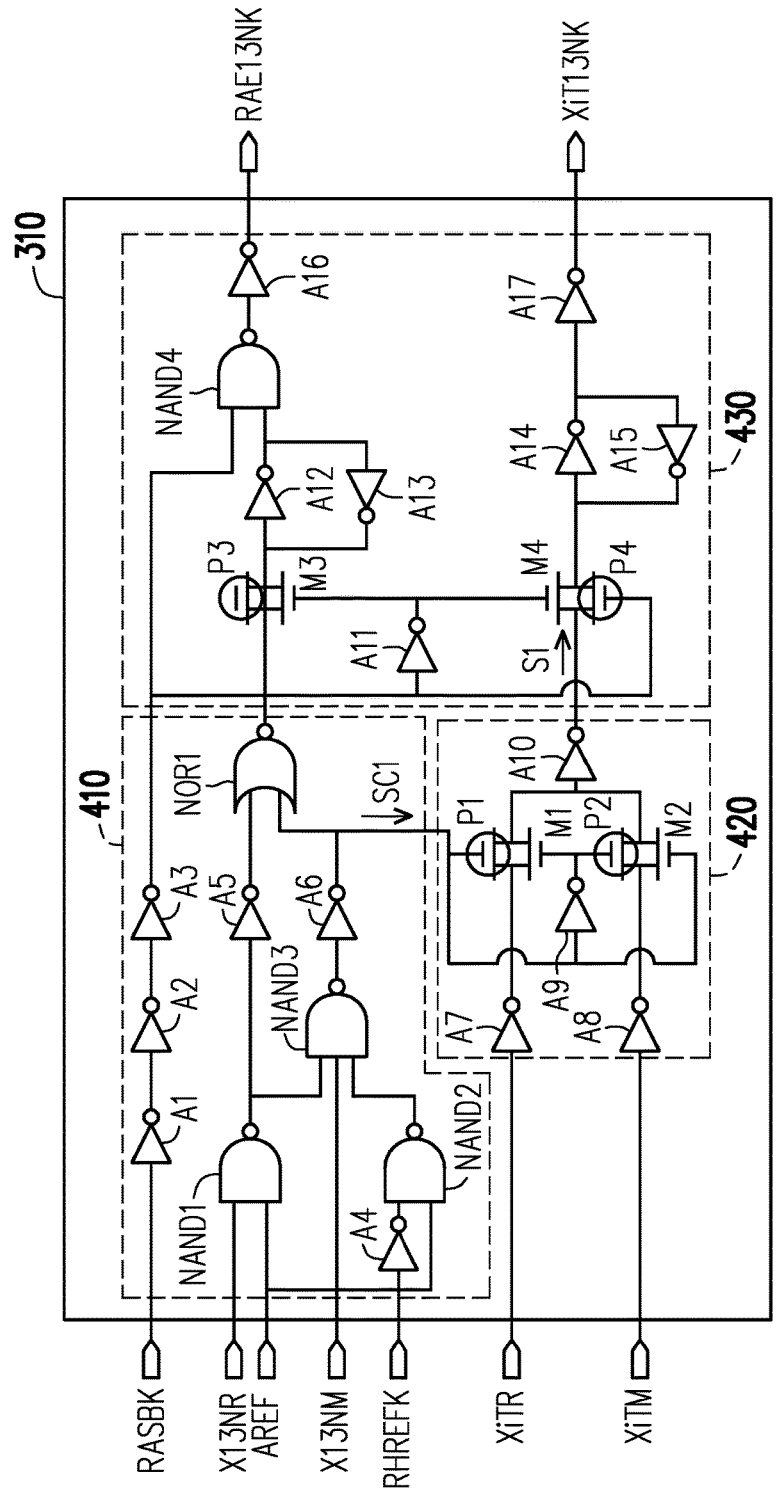
FIG. 4 is a schematic diagram of a multiplex circuit according to an embodiment of the disclosure.

FIG. 4 is a schematic diagram of a multiplex circuit according to an embodiment of the disclosure. Referring to FIG. 4, specifically, the multiplex circuit 310 may be embodied as shown in FIG. 4 and include a logic circuit 410, a selection circuit 420, and a latch circuit 430. The logic circuit 410 is coupled to the automatic refresh word line address register 304, the row hammer refresh word line address register 306, the selection circuit 420, and the latch circuit 430. The selection circuit 420 is further coupled to the latch circuit 430. The logic circuit 410 may output a selection control signal SC1 according to the bit value of the highest bit of the automatic refresh word line address and the bit value of the highest bit of the row hammer refresh word line address. The selection circuit 420 outputs a word line address signal S1 according to the selection control signal SC1, a bit value other than the highest bit in the automatic refresh word line address, and a bit value other than the highest bit in the row hammer refresh word line address. The latch circuit 430 may latch the word line address signal S1 to provide a latch result to the decoder 314 for decoding and thereby select the word line for memory cell data refreshing.

More specifically, in this embodiment, the logic circuit 410 may include NOT gates A1 to A6, NAND gates NAND1 to NAND3, and a NOR gate NOR1. The selection circuit 420 may include NOT gates A7 to A10, P-type transistors P1 and P2, and N-type transistors M1 and M2. The latch circuit 430 may include NOT gates A11 to A17, a NAND gate NAND4, P-type transistors P1 and P2, and N-type transistors M1 and M2. In the logic circuit 410, the NOT gates A1 to A3 are connected in series. The input terminal (the input terminal of the NOT gate A1) of the NOT gates A1 to A3 connected in series is used to receive the partial block row selection signal RASBK, and the output terminal (the output terminal of the NOT gate A3) of the NOT gates A1 to A3 connected in series is coupled to the first input terminal of the NAND gate NAND4. The first input terminal of the NAND gate NAND 1 receives the automatic refresh word line address signal X13NR and the all block refresh signal AREF. The output terminal of the NAND gate NAND1 is coupled to the first input terminal of the NOR gate NOR1 via the NOT gate A5. The input terminal of the NOT gate A4 receives the row hammer address refresh request signal RHREFK. The output terminal of the NOT gate A4 is coupled to the first input terminal of the NAND gate NAND2. The second input terminal of the NAND gate NAND2 receives the all block refresh signal AREF. The first input terminal of the NAND gate NAND3 is coupled to the output terminal of the NAND gate NAND1. The second input terminal of the NAND gate NAND3 receives the row hammer refresh word line address signal X13NM. The third input terminal of the NAND gate NAND3 is coupled to the output terminal of the NAND gate NAND2. The output terminal of the NAND gate NAND1 is coupled to the second input terminal of the NOR gate NOR1 via the NOT gate A6. The NOT gate A6 may output the selection control signal SC1.

In the selection circuit 420, the input terminal of the NOT gate A7 receives the automatic refresh word line address signal XiTR and the input terminal of the NOT gate A8 receives the row hammer refresh word line address signal XiTM. The output terminal of the NOT gate A7 is coupled to the input terminal of the NOT gate A10 via a transmission gate composed of the P-type transistor P1 and the N-type transistor M1. The output terminal of the NOT gate A8 is coupled to the input terminal of the NOT gate A10 via a transmission gate composed of the P-type transistor P2 and the N-type transistor M2. The gates of the P-type transistor P1 and the N-type transistor M2 are coupled to each other and are coupled to the output terminal of the NOT gate A6 and the input terminal of the NOT gate A9. The gates of the P-type transistor P2 and the N-type transistor M1 are coupled to each other and are coupled to the output terminal of the NOT gate A9.

In the latch circuit 430, the transmission gate composed of the P-type transistor P3 and the N-type transistor M3 is coupled between the output terminal of the NOR gate NOR1 and the input terminal of the NOT gate A12, and the transmission gate composed of the P-type transistor P4 and the N-type transistor M4 is coupled between the output terminal of the NOT A10 and the input terminal of the NOT gate A14. The gates of the P-type transistor P3 and the P-type transistor P4 are coupled to each other and are coupled to the output terminal of the NOT gate A3 and the input terminal of the NOT gate A11. The gates of the N-type transistor M3 and the N-type transistor M4 are coupled to each other and are coupled to the output terminal of the NOT gate A11. The output terminal of the NOT gate A12 is coupled to the second input terminal of the NAND gate NAND4. The output terminal and the input terminal of the NOT gate A13 are respectively coupled to the input terminal and the output terminal of the NOT gate A12. The NOT gate A16 is coupled between the output terminal of the NAND gate NAND4 and the output terminal of the multiplex circuit 310, and the NOT gate A16 is for outputting the partial block row enable signal RAE13NK. The output terminal and input terminal of the NOT gate A15 are respectively coupled to the input terminal and the output terminal of the NOT gate A14. The NOT gate A17 is coupled between the output terminal of the NOT gate A14 and another output terminal of the multiplex circuit 310. The NOT gate A17 is for outputting the partial block row address signal XiT13NK.

It should be noted that the multiplex circuit 310 of FIG. 4 corresponds to the memory cell array 106A, and the multiplex circuit 312 corresponding to the memory cell array 106B may be embodied in the same manner. When the multiplex circuit architecture shown in FIG. 4 is applied to the memory cell array 106B, the automatic refresh word line address signal X13NR and the row hammer refresh word line address signal X13NM respectively become the automatic refresh word line address signal 13TR and the row hammer refresh word line address signal X13TM. In addition, the partial block row enable signal RAE13NK and the partial block row address signal XiT13NK of the multiplex circuit 310 of FIG. 4 respectively become the partial block row enable signal RAE13TK and the partial block row address signal XiT13TK.

Figure 5:
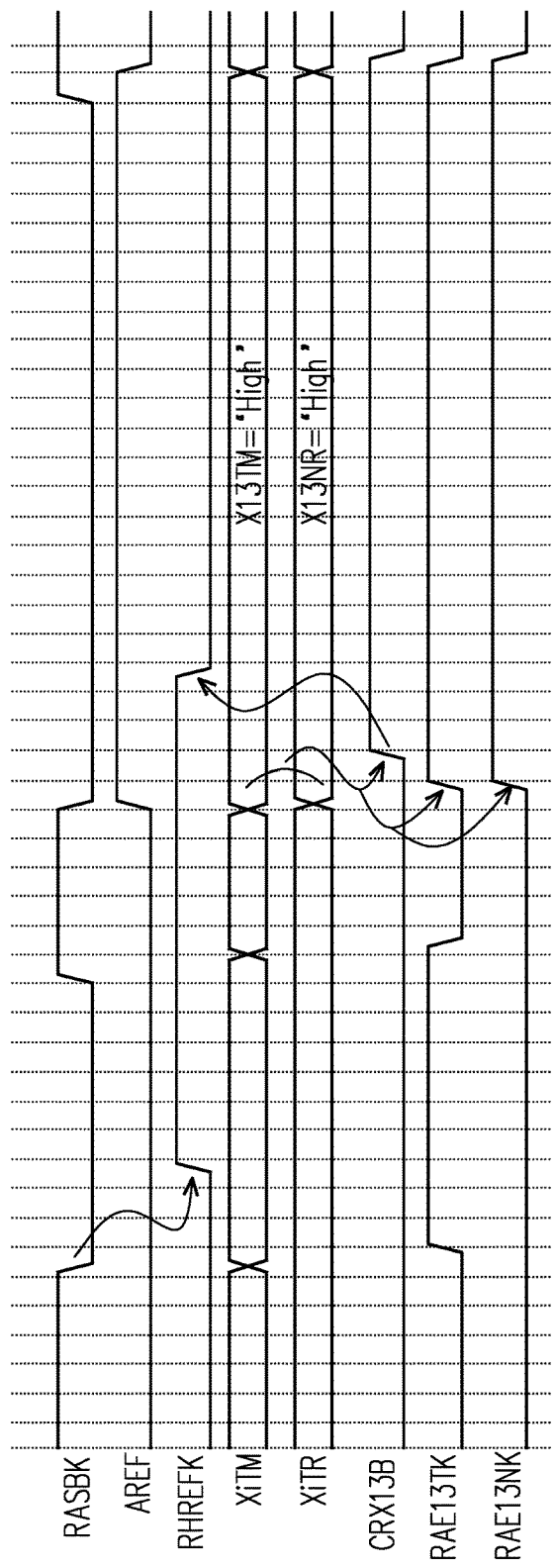
FIG. 5 and FIG. 6 are waveform diagrams of an input signal and an output signal of the multiplex circuit.
Figure 6:
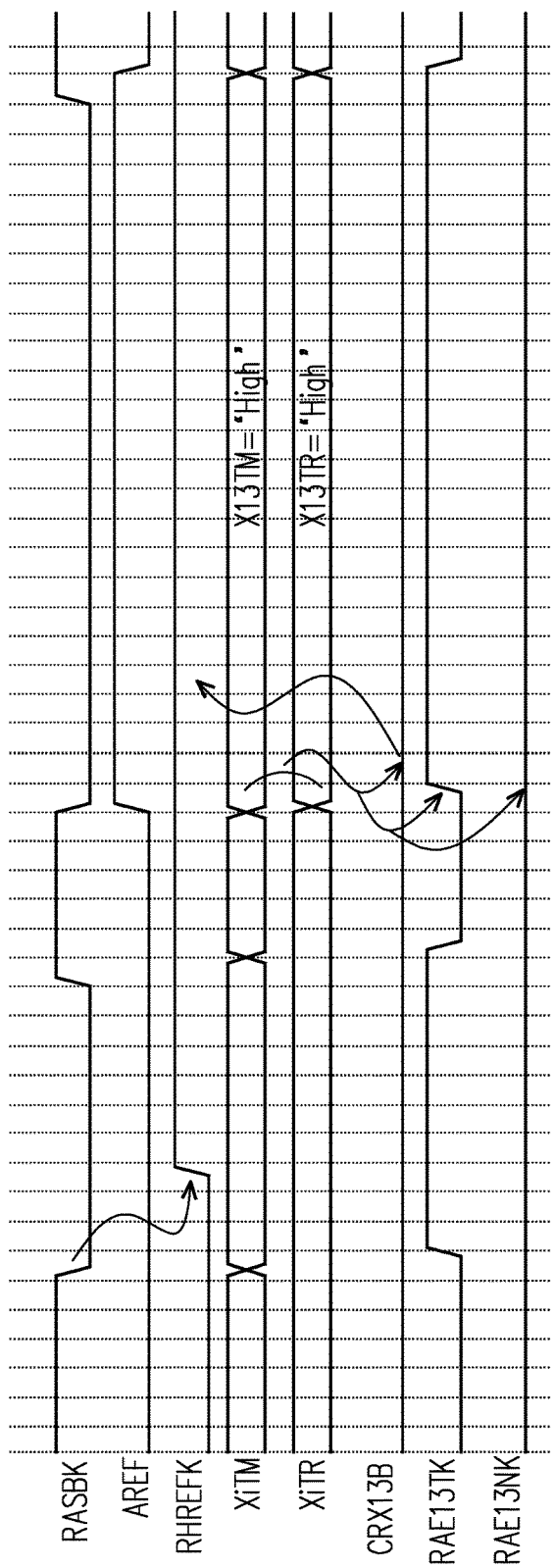

FIG. 5 and FIG. 6 are waveform diagrams of an input signal and an output signal of the multiplex circuit. Referring to FIG. 4 and FIG. 5, FIG. 5 is a waveform diagram showing a case where the automatic refresh word line address and the row hammer refresh word line address do not belong to the same memory cell array. As shown in FIG. 5, when the memory block is selected for data refreshing, the partial block row selection signal RASBK first changes to a low logic level, such that the row hammer address refresh request signal RHREFK changes to a high logic level. When entering a pre-charging stage, the partial block row selection signal RASBK changes to the high logic level. After the control circuit 302 receives an instruction to select all the memory blocks for data refreshing, the partial block row selection signal RASBK changes to the low logic level again. At this time, the all block refresh signal AREF changes from the low logic level to the high logic level. In this embodiment, the automatic refresh word line address and the row hammer refresh word line address do not belong to the same memory cell array, and the automatic refresh word line address signal X13NR and the row hammer refresh word line address signal X13TM are in the state of the high logic level "High". That is, the automatic refresh word line address belongs to the memory cell array 106A and the row hammer refresh word line address belongs to the memory cell array 106B. Therefore, the automatic refresh word line address signal XiTR and the row hammer refresh word line address signal XiTM may be respectively used for refreshing the memory cell data of the memory cell array 106A and the memory cell array 106B, such that the partial block row enable signal RAE13NK and the partial block row enable signal RAE13TK both change to the high logic level. In addition, because the refreshing for the memory cell of the row hammer refresh word line address is not postponed, the comparison result signal CRX13B generated by comparing the automatic refresh word line address signals X13TR and X13NR and the row hammer refresh word line address signals X13TM and X13NM changes to the high logic level, such that the row hammer address refresh request signal RHREFK changes to the low logic level.

Referring to FIG. 4 and FIG. 6, in the embodiment of FIG. 6, the automatic refresh word line address and the row hammer refresh word line address belong to the same memory cell array. The automatic refresh word line address signal X13TR and the row hammer refresh word line address signal X13TM are in the state of the high logic level "High". That is, the automatic refresh word line address belongs to the memory cell array 106B and the row hammer refresh word line address also belongs to the memory cell array 106B. Therefore, only the automatic refresh word line address signal XiTR may be used for refreshing the memory cell data of the memory cell array 106B, such that the partial block row enable signal RAE13NK is kept at the low logic level while the partial block row enable signal RAE13TK changes to the high logic level. In addition, because the refreshing for the memory cell of the row hammer refresh word line address is postponed, the comparison result signal CRX13B remains at the low logic level to maintain the row hammer address refresh request signal RHREFK at the high logic level, so as to wait for the next data refreshing cycle of the memory blocks to refresh the data of the memory cell corresponding to the row hammer refresh word line address, for which refreshing has been postponed.

Figure 7:
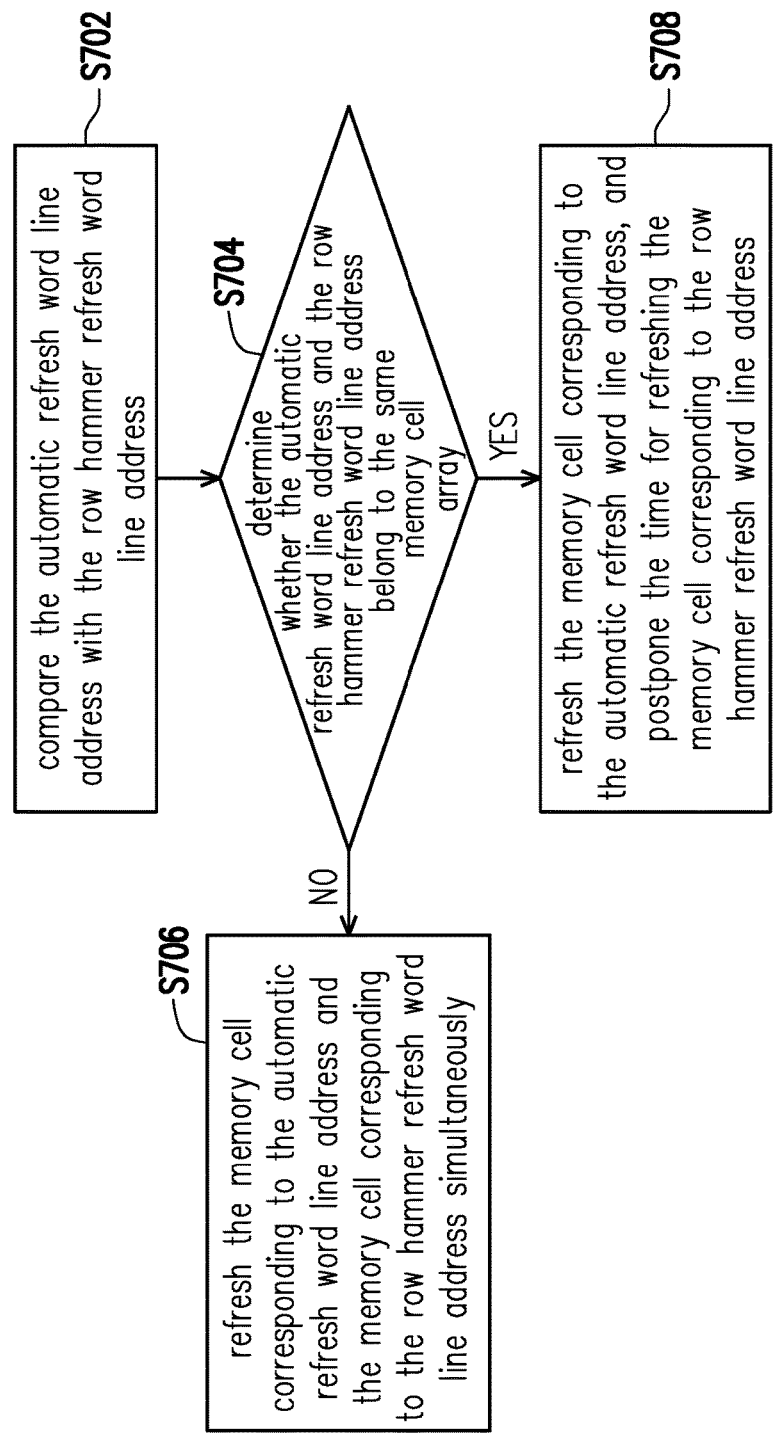
FIG. 7 is a flowchart of data refreshing of a memory device according to an embodiment of the disclosure.

FIG. 7 is a flowchart of data refreshing of a memory device according to an embodiment of the disclosure. Referring to FIG. 7, it is known from the above embodiments that the data refreshing of the memory device may at least include the following steps. First, the automatic refresh word line address and the row hammer refresh word line address are compared (Step S702). Next, whether the automatic refresh word line address and the row hammer refresh word line address belong to the same memory cell array is determined according to the comparison result (Step S704). A method of determining whether the automatic refresh word line address and the row hammer refresh word line address belong to the same memory cell array is for example to determine whether the automatic refresh word line address and the row hammer refresh word line address belong to the same memory cell array according to the bit values of the highest bits of the automatic refresh word line address and the row hammer refresh word line address. If the automatic refresh word line address and the row hammer refresh word line address do not belong to the same memory cell array, the memory cell corresponding to the automatic refresh word line address and the memory cell corresponding to the row hammer refresh word line address are refreshed simultaneously (Step S706). If the automatic refresh word line address and the row hammer refresh word line address belong to the same memory cell array, the memory cell corresponding to the automatic refresh word line address is refreshed, and the time for refreshing the memory cell corresponding to the row hammer refresh word line address is postponed (Step S708). The memory cell corresponding to the row hammer refresh word line address, for which refreshing is postponed, may be refreshed in the next data refreshing cycle of the memory block, for example.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A memory device, comprising:
    a memory block, comprising:
        a first memory cell array corresponding to a first address section; and
        a second memory cell array corresponding to a second address section; and
    a memory control circuit periodically refreshing memory cell data of the first memory cell array and the second memory cell array alternately, wherein when a row hammer event occurs, the memory control circuit compares an automatic refresh word line address with a row hammer refresh word line address to determine whether the automatic refresh word line address and the row hammer refresh word line address belong to a same memory cell array, and if the automatic refresh word line address and the row hammer refresh word line address belong to the same memory cell array, the memory control circuit refreshes a memory cell corresponding to the automatic refresh word line address and postpones a time for refreshing a memory cell corresponding to the row hammer refresh word line address.

2. The memory device according to claim 1, wherein a bit value of a highest bit of a word line address of the first memory cell array is different from a bit value of a highest bit of a word line address of the second memory cell array, and the memory control circuit determines whether the automatic refresh word line address and the row hammer refresh word line address belong to the same memory cell array according to a bit value of a highest bit of the automatic refresh word line address and a bit value of a highest bit of the row hammer refresh word line address.

3. The memory device according to claim 1, wherein the memory control circuit refreshes the memory cell corresponding to the row hammer refresh word line address, for which refreshing is postponed, in a next data refreshing cycle of the memory block.

4. The memory device according to claim 1, wherein if the automatic refresh word line address and the row hammer refresh word line address do not belong to the same memory cell array, the memory control circuit refreshes the memory cell corresponding to the automatic refresh word line address and the memory cell corresponding to the row hammer refresh word line address simultaneously.

5. The memory device according to claim 1, wherein the memory control circuit comprises:
    an automatic refresh word line address register storing the automatic refresh word line address;
    a row hammer refresh word line address register storing the row hammer refresh word line address;
    a comparison circuit coupled to the automatic refresh word line address register and the row hammer refresh word line address register and comparing the automatic refresh word line address with the row hammer refresh word line address to determine whether the automatic refresh word line address and the row hammer refresh word line address belong to the same memory cell array;
    a first multiplex circuit coupled to the first memory cell array, the automatic refresh word line address register, and the row hammer refresh word line address register and outputting a word line address for memory cell data refreshing according to the automatic refresh word line address and the row hammer refresh word line address;
    a second multiplex circuit coupled to the second memory cell array, the automatic refresh word line address register, and the row hammer refresh word line address register and outputting a word line address for memory cell data refreshing according to the automatic refresh word line address and the row hammer refresh word line address;
    a first decoder coupled to the first multiplex circuit and decoding the word line address outputted by the first multiplex circuit to select a word line for memory cell data refreshing; and
    a second decoder coupled to the second multiplex circuit and decoding the word line address outputted by the second multiplex circuit to select a word line for memory cell data refreshing.

6. The memory device according to claim 5, wherein the first multiplex circuit and the second multiplex circuit respectively comprise:
    a logic circuit coupled to the automatic refresh word line address register and the row hammer refresh word line address register and outputting a selection control signal according to the bit value of the highest bit of the automatic refresh word line address and the bit value of the highest bit of the row hammer refresh word line address;
    a selection circuit coupled to the logic circuit, the automatic refresh word line address register, and the row hammer refresh word line address register and outputting a word line address signal according to the selection control signal, a bit value other than the highest bit in the automatic refresh word line address, and a bit value other than the highest bit in the row hammer refresh word line address; and
    a latch circuit coupled to the logic circuit and the selection circuit and latching the word line address signal, wherein the first decoder and the second decoder select the word line for memory cell data refreshing according to a latch result of the corresponding latch circuit.

7. A data refreshing method adapted for a memory device, which comprises a memory block having a first memory cell array and a second memory cell array, wherein the first memory cell array corresponds to a first address section and the second memory cell array corresponds to a second address section, and memory cell data of the first memory cell array and the second memory cell array is periodically refreshed, the data refreshing method comprising:
   comparing an automatic refresh word line address with a row hammer refresh word line address; and
   if the automatic refresh word line address and the row hammer refresh word line address belong to a same memory cell array, refreshing a memory cell corresponding to the automatic refresh word line address and postponing a time for refreshing a memory cell corresponding to the row hammer refresh word line address.

8. The data refreshing method according to claim 7, wherein a bit value of a highest bit of a word line address of the first memory cell array is different from a bit value of a highest bit of a word line address of the second memory cell may, the data refreshing method further comprising:
   determining whether the automatic refresh word line address and the row hammer refresh word line address belong to the same memory cell array according to a bit value of a highest bit of the automatic refresh word line address and a bit value of a highest bit of the row hammer refresh word line address.

9. The data refreshing method according to claim 7, further comprising:
   refreshing the memory cell corresponding to the row hammer refresh word line address, for which refreshing is postponed, in a next data refreshing cycle of the memory block.

10. The data refreshing method according to claim 8, wherein if the automatic refresh word line address and the row hammer refresh word line address do not belong to the same memory cell array, the memory cell corresponding to the automatic refresh word line address and the memory cell corresponding to the row hammer refresh word line address are refreshed simultaneously.

* * * * *